United States Patent
Uda et al.

(10) Patent No.: US 8,084,278 B2
(45) Date of Patent: Dec. 27, 2011

(54) METHOD OF MANUFACTURING SILICON CARBIDE SEMICONDUCTOR DEVICE

(75) Inventors: Yukio Uda, Tokyo (JP); Koichi Sekiya, Tokyo (JP); Kazuo Kobayashi, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/961,868

(22) Filed: Dec. 7, 2010

(65) Prior Publication Data

US 2011/0223694 A1 Sep. 15, 2011

(30) Foreign Application Priority Data

Mar. 9, 2010 (JP) .................................. 2010-051371

(51) Int. Cl.
*H01L 21/31* (2006.01)
(52) U.S. Cl. ............................ 438/14; 438/758; 438/931
(58) Field of Classification Search .................. 438/522, 438/758, 767, 771, 778; 257/77, E21.051, 257/E21.055
See application file for complete search history.

(56) References Cited

U.S. PATENT DOCUMENTS

| | | | | |
|---|---|---|---|---|
| 5,246,884 A * | 9/1993 | Jaso et al. | | 438/693 |
| 7,275,861 B2* | 10/2007 | Volf et al. | | 374/1 |
| 7,449,361 B2* | 11/2008 | Baskaran et al. | | 438/105 |
| 7,473,929 B2* | 1/2009 | Kusumoto et al. | | 257/77 |
| 7,695,564 B1* | 4/2010 | Micovic et al. | | 117/95 |
| 7,820,534 B2* | 10/2010 | Sawada et al. | | 438/522 |
| 2006/0220027 A1* | 10/2006 | Takahashi et al. | | 257/77 |
| 2007/0015373 A1* | 1/2007 | Cowen et al. | | 438/758 |
| 2007/0224727 A1* | 9/2007 | Dory | | 438/105 |

FOREIGN PATENT DOCUMENTS

JP 2009-65112 3/2009

* cited by examiner

*Primary Examiner* — Steven Loke
*Assistant Examiner* — David Goodwin
(74) *Attorney, Agent, or Firm* — Oblon, Spivak, McClelland, Maier & Neustadt, L.L.P.

(57) ABSTRACT

A wafer WF is mounted in a substrate holder, and the substrate holder is placed in a film forming furnace. The film forming furnace is evacuated by a vacuum pump through a gas discharge part to remove remaining oxygen as completely as possible. Then, a temperature in the film forming furnace is heated to a range of 800° C. to 950° C. under reduced pressure while an inert gas such as Ar or helium (He) is being introduced through a gas introduction part. When the temperature reaches this temperature range, an inflow of the inert gas is stopped. Vaporized ethanol is introduced as a source gas into the film forming furnace through the gas introduction part, thus forming a graphite film on an entire surface of the wafer WF.

9 Claims, 4 Drawing Sheets

METHOD OF MANUFACTURING SILICON CARBIDE SEMICONDUCTOR DEVICE

BACKGROUND OF THE INVENTION

1. Field of the Invention

The present invention relates to a method of manufacturing a silicon carbide semiconductor device.

2. Description of the Background Art

Silicon carbide (SiC) enables manufacturing of a silicon carbide semiconductor device having higher breakdown voltage characteristics as compared with silicon (Si) which has been conventionally used, and is expected to provide a high-power semiconductor device for the next generation. In manufacturing a silicon carbide semiconductor device using such silicon carbide, to control a conductive type and conductivity, an n-type or p-type impurity ion is implanted in a silicon carbide wafer having a silicon carbide layer formed on a silicon carbide substrate by epitaxial growth, and after the ion implantation, in order to activate the implanted ion and additionally recover a crystal defect formed by the ion implantation, an annealing process step is performed in which the ion-implanted silicon carbide wafer is exposed to a high temperature in an inert gas atmosphere such as an argon (Ar) atmosphere. In a case where a silicon carbide wafer is used, in order to stabilize characteristics, it is preferable that the annealing process is performed under a temperature as high as possible, normally 1500° C. or higher, and desirably 1600° C. or higher.

However, when a silicon carbide wafer is annealed at a high temperature, a surface roughness called step bunching occurs in a surface of the silicon carbide wafer. The reason why the step bunching is formed is as follows.

A silicon carbide wafer is normally obtained by forming a silicon carbide layer on a silicon carbide substrate by epitaxial crystal growth. In this epitaxial growth, a growing crystal axis is inclined by 4 or 8 degrees with respect to a c-axis direction (a direction perpendicular to the [0001] plane which is a crystal plane), in order to prevent different crystal forms such as the 6H-1 type and the 4H type from occurring in the same crystal plane.

When a silicon carbide wafer obtained by the crystal growth with the crystal axis being inclined in this manner is exposed to a high temperature in the annealing process for example, Si and carbon (C) which are constituent elements evaporate from a surface of the silicon carbide wafer. In this evaporation, since silicon and carbon evaporate under different evaporation conditions and moreover the crystal axis is inclined, the amount of evaporation of silicon and the amount of evaporation of carbon differ in a silicon carbide wafer plane, which consequently causes the step bunching on the surface of the silicon carbide wafer.

The step bunching thus formed becomes an obstacle to the formation of a gate oxide film on the silicon carbide wafer after the annealing process, and also becomes an obstacle to the formation of a gate electrode on the gate oxide film. For example, there is a possibility that adhesion and leakage characteristics may deteriorate because a boundary surface between the silicon carbide wafer and the gate oxide film or between the gate oxide film and the gate electrode is uneven.

Therefore, preventing or reducing the step bunching is a significant problem in stabilizing the quality of and improve the yield of the silicon carbide semiconductor device.

As a method of preventing or reducing the step bunching, there is a method in which a carbon film is formed on a surface of a silicon carbide wafer and used as a protective film for preventing evaporation of silicon and carbon in the annealing process.

Japanese Patent Application Laid-Open No. 2009-65112 discloses a method of forming a carbon film using a hydrocarbon material gas or a hydrocarbon gas containing oxygen such as alcohol.

When a carbon film is used as a protective film for preventing evaporation of silicon and carbon in an annealing process, a certain degree of thickness is required. Thus, a film thickness control is an important factor, and it is necessary to examine whether a formed carbon film has a desired thickness or not.

To accurately measure the thickness of a carbon film, it is necessary that a silicon carbide wafer after the formation of the carbon film is cut in a thickness direction and the film thickness is measured on a resulting cross section. However, a silicon carbide wafer is very expensive, and cutting it for the purpose of measuring the thickness of the carbon film involves an problem that a manufacturing cost of a semiconductor device is increased.

SUMMARY OF THE INVENTION

An object of the present invention is to provide a method of manufacturing a silicon carbide semiconductor device capable of measuring the thickness of a protective film for preventing evaporation of silicon and carbon in an annealing process, with a high accuracy and a low cost.

In a first aspect of the present invention, a method of manufacturing a silicon carbide semiconductor device includes the steps of: (a) forming an active region of a silicon carbide semiconductor device by ion-implanting an impurity in a surface of a silicon carbide wafer; (b) forming a graphite film on an entire surface of the silicon carbide wafer which is obtained after the active region is formed and an entire surface of a silicon wafer which is used as a film thickness monitor, by a chemical vapor deposition; and (c) evaluating the thickness of the graphite film. The step (b) includes the step of forming the graphite film at a film-forming temperature of 950° C. or lower by the chemical vapor deposition. The step (c) includes the step of estimating the thickness of the graphite film formed on the silicon carbide wafer by measuring the thickness of the graphite film formed on the silicon wafer.

According to the first aspect mentioned above, the graphite film is formed at a film-forming temperature of 950° C. or lower by the chemical vapor deposition. Thereby, in a case where the silicon wafer is used as the film thickness monitor for the graphite film, a formation of a silicon carbide film having a non-uniform thickness on the surface of the silicon wafer can be prevented. Thus, when, after the graphite film is formed, the thickness of the graphite film which is formed on the surface of the silicon wafer is measured, the film thickness can be measured accurately. Moreover, since the silicon wafer is used as the film thickness monitor, the cost spent for the film thickness measurement can be suppressed low.

In a second aspect of the present invention, a method of manufacturing a silicon carbide semiconductor device includes the steps of: (a) forming an active region of a silicon carbide semiconductor device by ion-implanting an impurity in a surface of a silicon carbide wafer; (b) forming a graphite film on an entire surface of the silicon carbide wafer which is obtained after the active region is formed and an entire surface of a silicon wafer which is used as a film thickness monitor, by a chemical vapor deposition; and (c) evaluating the thickness of the graphite film. The step (b) includes the steps of: (b-1) forming a first-layer graphite film having a first thickness at a film-forming temperature of 950° C. or lower by the chemical vapor deposition; and (b-2) after forming the first-layer graphite film, forming a second-layer graphite film having a second thickness at a film-forming temperature of 1000° C. or higher by the chemical vapor deposition, thus forming the graphite film. The step (c) includes the step of estimating the thickness of the graphite film formed on the silicon carbide wafer by measuring the thickness of the graphite film formed on the silicon wafer.

According to the second aspect mentioned above, the first-layer graphite film having the first thickness is formed at a film-forming temperature of 950° C. or lower by the chemical vapor deposition. Thereby, in a case where the silicon wafer is used as the film thickness monitor for the graphite film, a formation of a silicon carbide film having a non-uniform thickness on the surface of the silicon wafer can be prevented. Thus, when, after the graphite film is formed, the thickness of the graphite film which is formed on the surface of the silicon wafer is measured, the film thickness can be measured accurately. Moreover, since the silicon wafer is used as the film thickness monitor, the cost spent for the film thickness measurement can be suppressed low. As for the second-layer graphite film, even if the film-forming temperature is 1000° C. or higher, a formation of a silicon carbide film on the surface of the silicon wafer is prevented due to the presence of the first-layer graphite film. Accordingly, a limit on the thickness of the second-layer graphite film is smaller. Setting the film-forming temperature to be 1000° C. or higher increases a film-forming rate by approximately three times. Thus, even if the thickness of the second-layer graphite film is increased to some extent, the throughput is not reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment 1

In the present status, a silicon carbide wafer is very expensive, and therefore from the viewpoint of avoiding the use of silicon carbide wafer as a film thickness monitor for a protective film, the present inventors have reached the technical idea of using a silicon wafer instead of a silicon carbide wafer, as a film thickness monitor.

Figure 1:
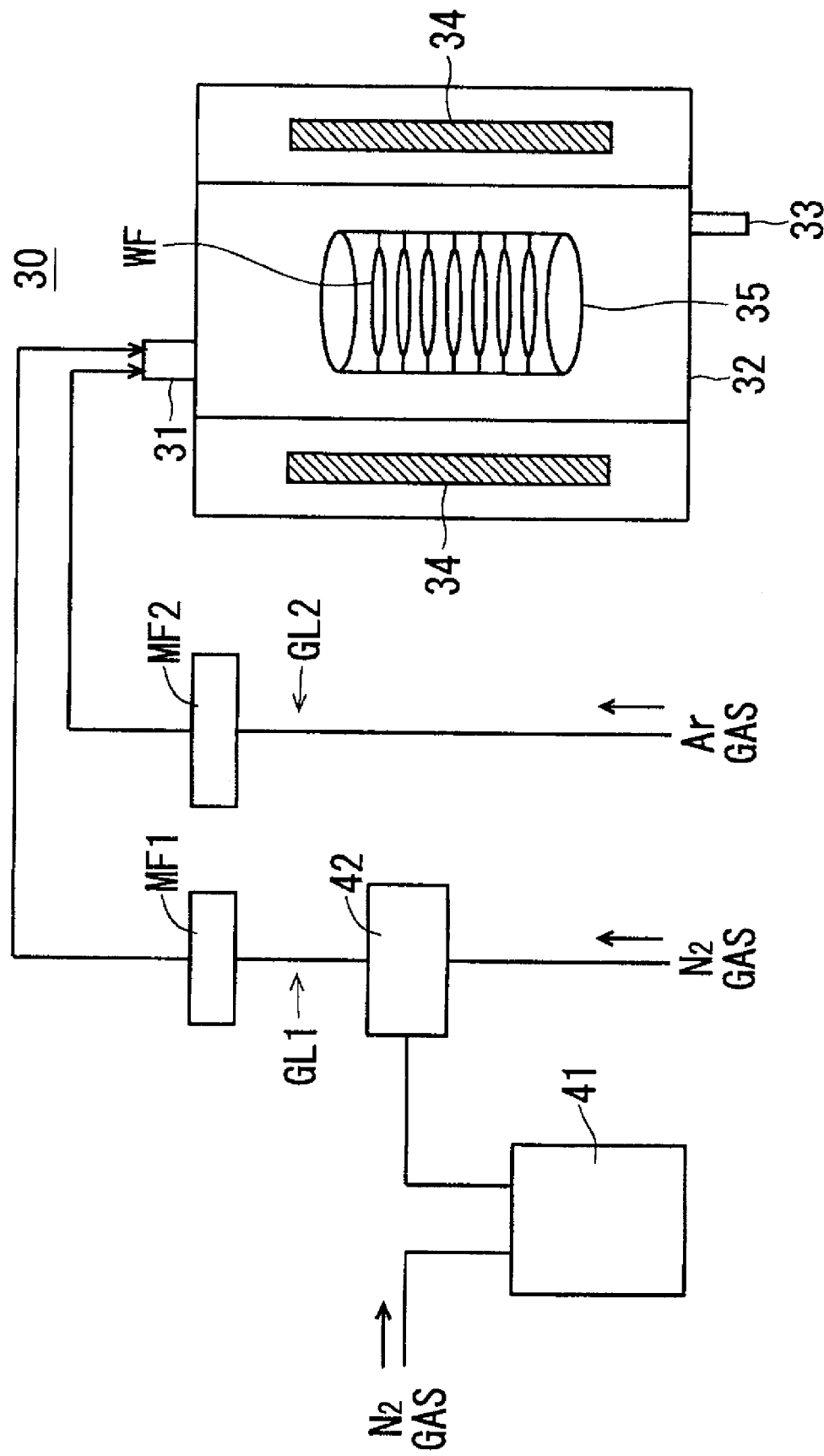
FIG. 1 is a diagram illustrating a configuration of a manufacturing apparatus used in a method of manufacturing a silicon carbide semiconductor device according to a preferred embodiment of the present invention.

FIG. 1 shows an outline of a film forming device for forming a graphite film which serves as a protective film on a silicon carbide wafer. Here, it is assumed that the graphite film is formed (deposited) by a chemical vapor deposition (CVD), and a configuration of a CVD device 30 which is a typical film forming device is shown.

As shown in FIG. 1, the CVD device 30 includes a gas introduction part 31, a film forming furnace 32, a gas discharge part 33, a heater 34, and a substrate holder 35. The gas introduction part 31 is for the introduction of a source gas or the like which is used to form a graphite film. The film forming furnace 32 is for the formation of a graphite film on an entire surface of a wafer WF such as a silicon carbide wafer and a silicon wafer. The gas discharge part 33 is for the discharge of the source gas or the like. The heater 34 is provided at an outer circumferential portion of the film forming furnace 32 so as not to be in direct contact with the source gas. The substrate holder 35 holds the wafer WF such that the graphite film can be formed on the entire surface of the wafer WF, and allows a plurality of wafers WF to be simultaneously subjected to a batch process. As the substrate holder 35, the one which holds the wafer WF by supporting a peripheral portion of the wafer WF at three points is conceivable.

In a shown example, a gas obtained by vaporization of ethanol ($C_2H_4OH$) is used as the source gas. A gas supply system includes a source gas supply line GL1 and a inert gas supply line GL2. The source gas supply line GL1 is constituted by a tank 41 in which liquid ethanol is reserved, a vaporizer 42 connected to the tank 41 via a pipe, and a flowmeter MF1 which can control a gas flow rate and is connected to the vaporizer 42 via a pipe. The inert gas supply line GL2 supplies an inert gas such as an argon (Ar) gas. A flowmeter MF2 which controls a flow rate of the inert gas such as an Ar gas supplied from a gas cylinder (not shown) is connected to the inert gas supply line GL2.

An inert gas such as a nitrogen ($N_2$) gas is supplied to the tank 41, so that the liquid ethanol is fed out toward the vaporizer 42 by the pressure of the inert gas such as a $N_2$ gas. An inert gas such as a $N_2$ gas is also supplied to the vaporizer 42. In the vaporizer 42, the liquid ethanol supplied from the tank 41 is heated, and vaporized ethanol is transported through the pipe toward the film forming furnace 32 by the inert gas such as the $N_2$ gas. The source gas supply line GL1 is covered by a heater or the like in order to avoid re-liquefaction of the vaporized ethanol, though not shown.

The configuration of the CVD device 30 shown in FIG. 1 is merely illustrative, and any configuration equivalent thereto is acceptable.

To form a graphite film by using the CVD device 30 described above, the wafer WF is mounted in the substrate holder 35 and placed in the film forming furnace 32, the film forming furnace 32 is evacuated by a vacuum pump (not shown) through the gas discharge part 33 to remove remaining oxygen as completely as possible, and then a temperature in the film forming furnace 32 is heated to a range of 500° C. to 1000° C. under reduced pressure while an inert gas such as Ar or helium (He) is being introduced through the gas introduction part 31. When the temperature reaches the above-mentioned temperature range, an inflow of the inert gas except a carrier gas of ethanol is stopped. Vaporized ethanol is introduced as the source gas into the film forming furnace 32 through the gas introduction part 31, thus forming the graphite film on the entire surface of the wafer WF.

In this manner, a graphite film is formed while a plurality of silicon carbide wafers and at least one silicon wafer are mounted in the substrate holder 35 which allows the plurality of wafers WF to be simultaneously subjected to a batch process. Thereby, graphite films having the same thickness are formed on a surface of the silicon wafer and a surface of the silicon carbide wafer. Here, a problem has become obvious when a graphite film is formed on the surface of the silicon wafer, though the problem does not occur in a case of the silicon carbide wafer.

Figure 2:
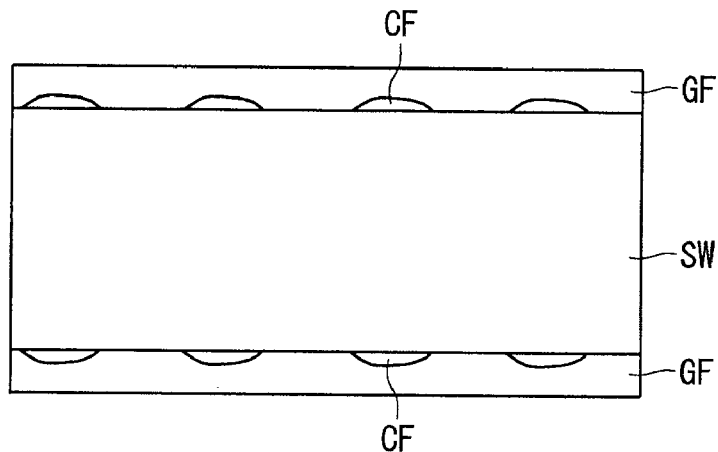
FIG. 2 is a cross-sectional view of a silicon wafer on which a graphite film is formed.

That is, when a graphite film is formed on a silicon carbide wafer, a film-forming temperature is set at approximately 1000° C. for shortening a film-forming time period. However, it has been revealed that if the same condition is applied to a silicon wafer used as a film thickness monitor, a silicon carbide film having a non-uniform thickness is formed on a surface of the silicon wafer at an initial stage of the film formation. FIG. 2 schematically shows a state where a silicon carbide film CF having a non-uniform thickness is formed on a surface of a silicon wafer SW. The silicon carbide film CF is not always a continuous film, but often formed on a silicon surface in a discontinuous manner and with a non-uniform thickness. FIG. 2 shows a cross section of a part of the silicon wafer SW, and the silicon carbide film CF is shown as if it was formed only on upper and lower main surfaces of the silicon wafer SW. However, the silicon carbide film CF is actually formed on a side surface of the silicon wafer SW, too. The same applies to the other cross-sectional views.

After the silicon carbide film CF is formed, a graphite film GF is formed. Here, a problem arises that since the silicon carbide film CF is formed with a non-uniform thickness, it is impossible to accurately measure the thickness of the graphite film GF formed on the silicon carbide film CF.

Although a mechanism of the silicon carbide film CF being formed on the surface of the silicon wafer SW is not clearly recognized, it can be considered that a silicon wafer has a lower heat resistance than that of a silicon carbide wafer and therefore if the silicon wafer is heated to approximately 1000° C., a silicon atom flies out of the wafer and reacts with a carbon atom included in the source gas to form a silicon carbide film CF.

Based on this consideration, the inventors have examined the film-forming temperature, and obtained a result that the formation of the silicon carbide film CF can be prevented by lowering the film-forming temperature.

Figure 3:
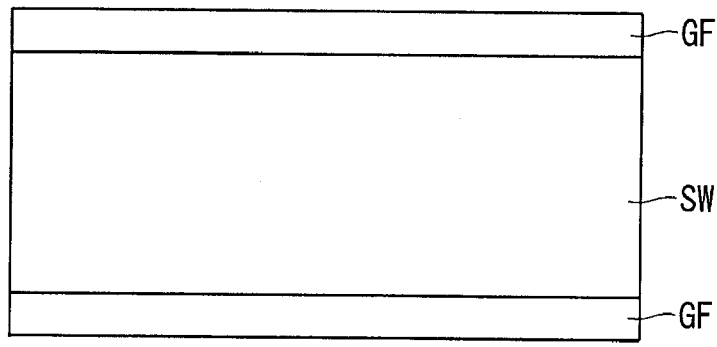
FIG. 3 is a cross-sectional view of a silicon wafer on which a graphite film is formed by a method of manufacturing a silicon carbide semiconductor device according to a preferred embodiment 1 of the present invention.

To be specific, by setting the film-forming temperature to be in a range of 800° C. to 950° C. (800° C. or higher and 950° C. or lower), the formation of the silicon carbide film CF on the surface of the silicon wafer SW was prevented, and the graphite film GF having a desired thickness could be formed. FIG. 3 schematically shows this state.

Here, the thickness of the graphite film GF is set to be 30 nm to 500 nm (30 nm or more and 500 nm or less), in order that the graphite film GF can surely fulfill a function as a protective film for preventing step bunching in the silicon carbide wafer during an activation annealing.

If the film-forming temperature is lowered, a film-forming rate becomes low. Therefore, in a case where the film-forming temperature is lowered, the graphite film GF is formed with a relatively small thickness. Thereby, a reduction of throughput can be prevented.

By setting the film-forming temperature for the graphite film GF to be in the range of 800° C. to 950° C., the formation of a silicon carbide film having a non-uniform thickness on the surface of the silicon wafer SW can be prevented, in a case where the silicon wafer SW is used as the film thickness monitor for the graphite film GF. After the graphite film GF is formed, the substrate holder 35 is taken out of the film forming furnace 32, and the thickness of the graphite film GF formed on the surface of the silicon wafer SW is measured. At this time, the film thickness can be measured accurately.

The thickness of the graphite film GF of the silicon wafer SW measured in this manner is estimated to be equal to the thickness of the graphite film GF on the silicon carbide wafer. When the measured thickness of the graphite film GF does not reach a desired thickness, the silicon carbide wafers and the silicon wafer are returned into the film forming furnace 32 and the film formation is performed again. Thus, an accurate film thickness control can be performed. Moreover, since the silicon wafer SW is used as the film thickness monitor, the cost spent for the film thickness measurement can be suppressed low.

Preferred Embodiment 2

A method of manufacturing a silicon carbide semiconductor device according to a preferred embodiment 2 of the present invention will be described with reference to FIGS. 4 to 8.

Figure 4:
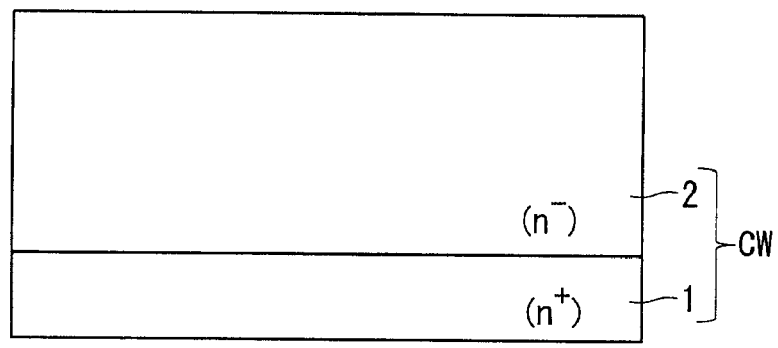
FIGS. 4 to 6 are cross-sectional views illustrating a method of manufacturing a silicon carbide semiconductor device according to a preferred embodiment 2 of the present invention.
Figure 5:
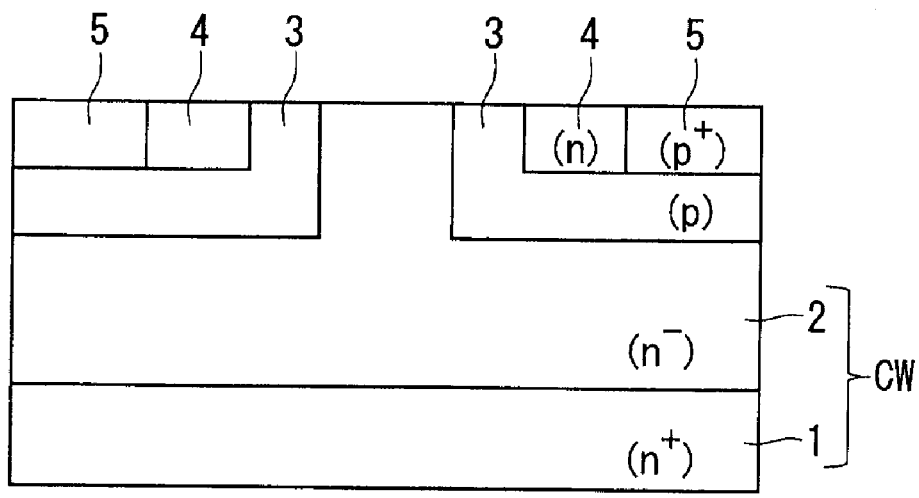
Figure 6:
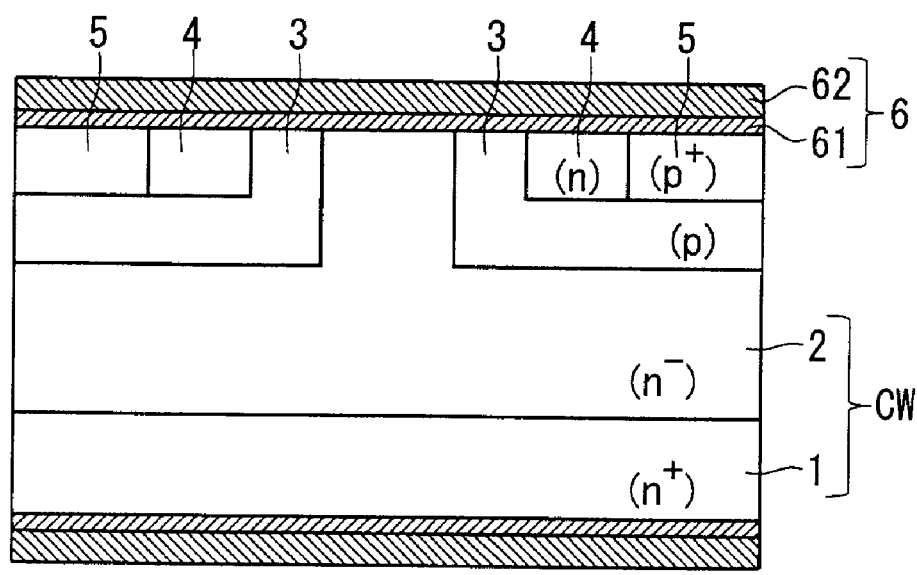

FIGS. 4 to 6 are diagrams sequentially showing manufacturing steps of a power MOSFET (Power Metal Oxide Semiconductor Field Effect Transistor), up to a step of forming a graphite film.

Here, the term "MOS" was formerly used to express a layered structure of metal-oxide-semiconductor, and is supposed to be named after the initial letters of Metal-Oxide-Semiconductor. However, particularly in a field effect transistor (hereinafter simply referred to as a "MOS transistor") having a MOS structure, materials of a gate insulating film and a gate electrode have been improved from the viewpoint of the recent integrations and improvement in the manufacturing process.

For example, in a MOS transistor, mainly from the viewpoint of the source and drain being formed in a self-aligning manner, polycrystalline silicon instead of a metal has been adopted as a material of a gate electrode. Additionally, from the viewpoint of improving electrical characteristics, a high dielectric material is adopted as a material of a gate insulating film, but this material is not necessarily limited to an oxide.

Accordingly, the use of the term "MOS" is not always limited to a layered structure of metal/oxide/semiconductor, and such a limitation is not applied to the present specification, either. Therefore, in view of the common general technical knowledge, the term "MOS" is not only used as the acronym originating from its etymology, but also means a layered structure of conductor/insulator/semiconductor in a broad sense.

Firstly, in a step shown in FIG. 4, a silicon carbide layer 2 having a relatively low concentration ($n^-$) of an n-type (first conductive type) impurity is formed on one main surface of a semiconductor substrate 1 having a relatively high concentration ($n^+$) of the n-type impurity, by using epitaxial crystal growth. Here, for example, a silicon carbide substrate is preferably used as the semiconductor substrate 1. The semiconductor substrate 1 and the silicon carbide layer 2 constitute a silicon carbide wafer CW.

Then, in a step shown in FIG. 5, a p-type (second conductive type) impurity is ion-implanted in a surface of the silicon carbide wafer CW, and more specifically in a surface of the silicon carbide layer 2, by using a resist (not shown) as a mask. Thus, a plurality of well regions 3 spaced apart from each other are selectively formed. After the ion implantation, the resist is removed. Here, as the p-type impurity in the silicon carbide layer 2, boron (B) or aluminum (Al) may be mentioned, for example.

Then, an n-type impurity is ion-implanted in a surface of each of the well regions 3 by using a resist (not shown) as a mask, to selectively form source regions 4. After the ion implantation, the resist is removed. Here, as the n-type impurity in the well region 3, phosphorus (P) or nitrogen (N) may be mentioned, for example.

Then, by using a resist (not shown) as a mask, a p-type impurity is ion-implanted such that the source regions 4 are in contact with the circumference of the p-type impurity, to form contact regions 5 having a relatively high concentration ($p^+$) of the p-type impurity. After the ion implantation, the resist is removed. Here, the impurity concentration of the contact region 5 is set relatively higher than the impurity concentration of the well region 3. As this p-type impurity, boron (B) or aluminum (Al) may be mentioned, for example.

Then, in a step shown in FIG. 6, a graphite film 6 having two layers is formed (deposited) on an entire surface of the silicon carbide wafer by a chemical vapor deposition (CVD).

For the formation of the graphite film 6, the CVD device 30 described with reference to FIG. 1 may be used. A plurality of the silicon carbide wafers CW which have been processed up to the step of FIG. 5, and at least one silicon wafer SW, are mounted in the substrate holder 35, and the substrate holder 35 is placed within the film forming furnace 32. Through a sequence of operations, namely, the evacuation, the introduction of the inert gas, the heating of the film forming furnace 32 up to the film-forming temperature under reduced pressure, and the introduction of the source gas, the graphite film is formed on the entire surfaces of the silicon carbide wafers CW and the silicon wafer SW.

At this time, firstly, in a state of the temperature is being controlled such that the film-forming temperature is within the range of 800° C. to 950° C., a first-layer graphite film 61 is formed so as to have a predetermined thickness, and then the film-forming temperature is raised up to 1000° C. or higher, and a second-layer graphite film 62 is formed so as to have a predetermined thickness. The first-layer graphite film 61 and the second-layer graphite film 62 constitute the graphite film 6.

Here, the thickness of the first-layer graphite film 61 is set to be 5 nm to 10 nm (5 nm or more and 10 nm or less) for example, and more desirably 8 nm to 10 nm (8 nm or more 10 nm or less), by adjusting the film-forming time period. The thickness of the second-layer graphite film 62 is set such that the total thickness of the graphite film 6 which is the combined thickness of the first-layer graphite film 61 and the second-layer graphite film 62 can be 30 nm to 500 nm, by adjusting the film-forming time period. Since the film-forming rate changes depending on the film-forming temperature, the film-forming time period is adjusted in accordance with the film-forming temperature.

By setting the thickness of the first-layer graphite film 61 to be 5 nm to 10 nm and more desirably 8 nm to 10 nm, the ethanol supplied when forming the second-layer graphite film 62 can be prevented from reacting with the silicon wafer SW.

At this time, by setting the total thickness of the graphite film 6 to be 30 nm to 500 nm, the graphite film 6 can surely fulfill the function as a protective film for preventing step bunching in the silicon carbide wafer CW during an activation annealing.

Figure 7:
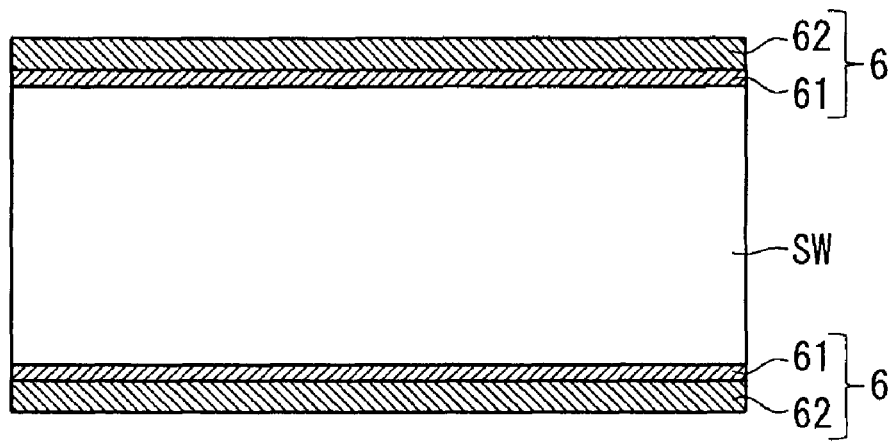
FIG. 7 is a cross-sectional view of a silicon wafer on which a graphite film is formed by the method of manufacturing a silicon carbide semiconductor device according to the preferred embodiment 2 of the present invention.
Figure 8:
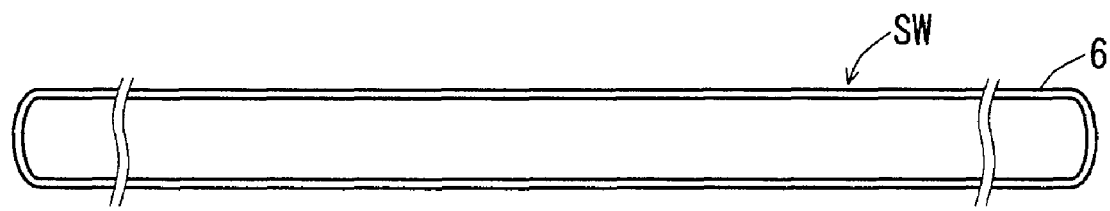
FIG. 8 is a cross-sectional view of the whole of a silicon wafer on which a graphite film is formed.

FIG. 7 shows a state where the first-layer graphite film 61 and the second-layer graphite film 62 are formed on the surface of the silicon wafer SW. FIG. 8 schematically shows a state where the graphite film 6 is formed on the entire surface of the silicon wafer SW.

In this manner, by forming the first-layer graphite film 61 at the film-forming temperature of 800° C. to 950° C., a formation of a silicon carbide film having a non-uniform thickness on the surface of the silicon wafer SW can be prevented. Thus, the film thickness can be measured accurately when, after the second-layer graphite film 62 is formed, the substrate holder 35 can be taken out of the film forming furnace 32, and the thickness of the graphite film 6 formed on the surface of the silicon wafer SW is measured.

By setting the film-forming temperature for the second-layer graphite film 62 to be 1000° C. or higher, the film-forming rate can be increased. However, since the silicon wafer SW is used as the film thickness monitor, it is impractical to raise the temperature above the upper temperature limit of the silicon wafer SW, that is, above 1400° C.

The thickness of the graphite film 6 formed on the silicon wafer SW is measured in this manner, and estimated to be equal to the thickness of the graphite film 6 formed on the silicon carbide wafer CW. When the measured thickness of the graphite film 6 does not reach a desired thickness, the silicon carbide wafers CW and the silicon wafer SW are returned into the film forming furnace 32 and the film formation is performed again. Thus, an accurate film thickness control can be performed. When the thickness of the graphite film 6 reaches the desired thickness, the silicon carbide wafers CW are directly mounted in an annealing device (not shown), and an activation annealing is performed on the implanted impurities.

The first-layer graphite film 61 is formed at a low film-forming rate, because the first-layer graphite film 61 has to be formed at a relatively low temperature (950° C. or lower) in order to prevent a formation of a silicon carbide film having a non-uniform thickness on the silicon wafer SW. Thus, increasing the thickness of the first-layer graphite film 61 is not desirable from the viewpoint of throughput. Therefore, the first-layer graphite film 61 is formed so as to have a thickness that can prevent the ethanol supplied when forming the second-layer graphite film 62 from reacting with the silicon wafer SW. By thus forming the first-layer graphite film 61 as thin as possible, a reduction of the throughput can be prevented.

As for the second-layer graphite film 62, on the other hand, even if the film-forming temperature is 1000° C. or higher, a formation of a silicon carbide film on the surface of the silicon wafer SW is prevented due to the presence of the first-layer graphite film 61. Accordingly, a limit on the thickness of the second-layer graphite film 62 is smaller. Setting the film-forming temperature 1000° C. or higher increases the film-forming rate by approximately three times. Thus, even if the thickness of the second-layer graphite film 62 is increased to some extent, the throughput is not reduced. Therefore, the thickness of the second-layer graphite film 62 may be set to be a thickness that can surely prevent occurrence of step bunching during the activation annealing for the implanted impurities.

By setting the thickness of the first-layer graphite film 61 to be 8 nm to 10 nm and the thickness of the second-layer graphite film 62 to be approximately 20 nm, when the total thickness of the graphite film 6 is approximately 30 nm, the graphite film 6 which functions as the protective film for preventing step bunching during the activation annealing can be obtained for the shortest time period.

In the above description, the manufacturing process of a MOSFET is taken as an example, but needless to say, the present invention is applicable to SiC devices other than the MOSFET.

<Modification>

The preferred embodiments 1 and 2 described above have the advantage that handling is easy, because vaporized ethanol is used as the source gas.

However, the source gas is not limited thereto, and methanol ($CH_3OH$), cetanol ($CH_3(CH_2)_{15}OH$), or the like, may be used.

In a practical sense, a low molecular gas having a carbon number of 10 or less is desirable, rather than a high molecular weight gas. In addition, a gas having a high vapor pressure is more desirable. From this point of view, a lower alcohol such as ethanol or methanol is desirable.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a silicon carbide semiconductor device, comprising the steps of:
    (a) forming an active region of a silicon carbide semiconductor device by ion-implanting an impurity in a surface of a silicon carbide wafer;
    (b) forming a graphite film on an entire surface of said silicon carbide wafer which is obtained after said active region is formed and an entire surface of a silicon wafer which is used as a film thickness monitor, by a chemical vapor deposition; and
    (c) evaluating the thickness of said graphite film,
    wherein
    said step (b) includes the step of forming said graphite film at a film-forming temperature of 950° C. or lower by said chemical vapor deposition,
    said step (c) includes the step of estimating the thickness of said graphite film formed on said silicon carbide wafer by measuring the thickness of said graphite film formed on said silicon wafer.

2. The method of manufacturing a silicon carbide semiconductor device according to claim 1, wherein
    said step (b) includes the step of forming said graphite film so as to have a thickness of 30 nm or more and 500 nm or less.

3. The method of manufacturing a silicon carbide semiconductor device according to claim 1, wherein
    said step (b) includes the step of forming said graphite film with said film-forming temperature being 800° C. or higher and 950° C. or lower.

4. A method of manufacturing a silicon carbide semiconductor device, comprising the steps of:
    (a) forming an active region of a silicon carbide semiconductor device by ion-implanting an impurity in a surface of a silicon carbide wafer;
    (b) forming a graphite film on an entire surface of said silicon carbide wafer which is obtained after said active region is formed and an entire surface of a silicon wafer which is used as a film thickness monitor, by a chemical vapor deposition; and
    (c) evaluating the thickness of said graphite film,
    wherein
    said step (b) includes the steps of:
        (b-1) forming a first-layer graphite film having a first thickness at a film-forming temperature of 950° C. or lower by said chemical vapor deposition; and
        (b-2) after forming said first-layer graphite film, forming a second-layer graphite film having a second thickness at a film-forming temperature of 1000° C. or higher by said chemical vapor deposition, thus forming said graphite film,
    said step (c) includes the step of estimating the thickness of said graphite film formed on said silicon carbide wafer by measuring the thickness of said graphite film formed on said silicon wafer.

5. The method of manufacturing a silicon carbide semiconductor device according to claim 4, wherein
    said step (b) includes the step of forming said graphite film such that the sum of said first thickness and said second thickness is 30 nm or more and 500 nm or less.

6. The method of manufacturing a silicon carbide semiconductor device according to claim 5,
    said step (b) includes the step of forming said first-layer graphite film so as to have a thickness of 8 nm or more and 10 nm or less.

7. The method of manufacturing a silicon carbide semiconductor device according to claim 4, wherein
    said step (b-1) includes the step of forming said first-layer graphite film with said film-forming temperature being 800° C. or higher and 950° C. or lower,
    said step (b-2) includes the step of forming said second-layer graphite film with said film-forming temperature being 1000° C. or higher and 1400° C. or lower.

8. The method of manufacturing a silicon carbide semiconductor device according to claim 1, wherein
    said step (b) includes the step of forming said graphite film by using vaporized alcohol as a source gas of said chemical vapor deposition.

9. The method of manufacturing a silicon carbide semiconductor device according to claim 4, wherein
    said step (b) includes the step of forming said graphite film by using vaporized alcohol as a source gas of said chemical vapor deposition.

* * * * *